(12) United States Patent
Chang et al.

(10) Patent No.: US 11,502,040 B2
(45) Date of Patent: Nov. 15, 2022

(54) PACKAGE STRUCTURE AND SEMICONDUCTOR PACAKGE

(71) Applicant: Taiwan Semiconductor Manufacturing Company, Ltd., Hsinchu (TW)

(72) Inventors: Jung-Hua Chang, Hsinchu (TW); Chin-Fu Kao, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 3 days.

(21) Appl. No.: 17/315,379

(22) Filed: May 10, 2021

(65) Prior Publication Data

US 2021/0280519 A1    Sep. 9, 2021

Related U.S. Application Data

(63) Continuation of application No. 16/727,928, filed on Dec. 27, 2019, now Pat. No. 11,004,797, which is a (Continued)

(51) Int. Cl.
*H01L 23/00* (2006.01)
*H01L 23/538* (2006.01)
*H01L 21/768* (2006.01)
*H01L 21/56* (2006.01)
*H01L 23/522* (2006.01)

(52) U.S. Cl.
CPC ........ *H01L 23/5384* (2013.01); *H01L 21/565* (2013.01); *H01L 21/76876* (2013.01); *H01L 23/5226* (2013.01); *H01L 24/17* (2013.01); *H01L 2224/0231* (2013.01)

(58) Field of Classification Search
CPC ............... H01L 23/5384; H01L 21/565; H01L 21/76876; H01L 23/5226; H01L 24/17; H01L 2224/0231; H01L 23/5389; H01L 24/19; H01L 24/20; H01L 21/568; H01L 23/3128; H01L 23/49816; H01L 2221/6834; H01L 21/6836; H01L 2221/68327; H01L 2221/68331; H01L 2221/68345; H01L 2221/68359;
(Continued)

(56) References Cited

U.S. PATENT DOCUMENTS 9,000,584 B2   4/2015  Lin et al.
9,048,222 B2   6/2015  Hung et al.
(Continued)

*Primary Examiner* — Elias Ullah
(74) *Attorney, Agent, or Firm* — JCIPRNET

(57) ABSTRACT

A package structure includes a semiconductor die, a plurality of conductive features, a bridge structure, an underfill, via structures and an encapsulant. The conductive features are electrically connected to the semiconductor die, wherein the conductive features include a first group with planar top surfaces, and a second group with uneven top surfaces. The bridge structure is partially overlapped with the semiconductor die and electrically connected to the first group of the conductive feature. The underfill is covering and contacting the first group of the conductive features. The via structures are disposed on and overlapped with the semiconductor die and electrically connected to the second group of the conductive features. The encapsulant is covering and contacting the via structures and the second group of the conductive features.

20 Claims, 9 Drawing Sheets

Related U.S. Application Data continuation of application No. 16/035,693, filed on Jul. 15, 2018, now Pat. No. 10,522,470.

(58) Field of Classification Search
CPC . H01L 2221/68372; H01L 2224/16227; H01L 2224/18; H01L 2224/96; H01L 21/6835
See application file for complete search history.

(56) References Cited

U.S. PATENT DOCUMENTS

| | | |
|---|---|---|
| 9,048,233 B2 | 6/2015 | Wu et al. |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |

PACKAGE STRUCTURE AND SEMICONDUCTOR PACAKGE

CROSS-REFERENCE TO RELATED APPLICATION

This application is a continuation application of U.S. application Ser. No. 16/727,928, filed on Dec. 27, 2019, now allowed. The prior U.S. application Ser. No. 16/727,928 is a continuation application and claims the priority benefit of U.S. application Ser. No. 16/035,693, filed on Jul. 15, 2018, now patented as U.S. Pat. No. 10,522,470, issued on Dec. 31, 2019. The entirety of each of the above-mentioned patent applications is hereby incorporated by reference herein and made a part of this specification.

BACKGROUND

Semiconductor devices and integrated circuits used in a variety of electronic applications, such as cell phones and other electronic equipment, are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
FIG. 1 to FIG. 15 are schematic sectional views of various stages in a method of fabricating a package structure according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 15 are schematic sectional views of various stages in a method of fabricating a package structure according to some exemplary embodiments of the present disclosure. Referring to FIG. 1, a carrier 102 with a buffer layer 104 coated thereon is provided. In one embodiment, the carrier 102 may be a glass carrier or any suitable carrier for carrying a semiconductor wafer or a reconstituted wafer used for the method of fabricating the package structure.

In some embodiments, the buffer layer 104 includes a de-bonding layer 104A and a dielectric layer 104B, wherein the de-bonding layer 104A is located in between the carrier 102 and the dielectric layer 104B. In certain embodiments, the de-bonding layer 104A is disposed on the carrier 102, and the material of the de-bonding layer 104A may be any material suitable for bonding and de-bonding the carrier 102 from the above layer(s) (e.g., the dielectric layer 104B) or any wafer(s) disposed thereon. In some embodiments, the de-bonding layer 104A may include a release layer (such as a light-to-heat conversion ("LTHC") layer) or an adhesive layer (such as an ultra-violet curable adhesive or a heat curable adhesive layer). In some embodiments, the dielectric layer 104B may be formed above the de-bonding layer 104A. The dielectric layer 104B may be made of dielectric materials such as benzocyclobutene ("BCB"), polybenzoxazole ("PBO"), or any other suitable polymer-based dielectric material.

It is noted that the materials of the carrier 102, the de-bonding layer 104A and the dielectric layer 104B are not limited to the descriptions of the embodiments. In some alternative embodiments, the dielectric layer 104B may be optionally omitted; in other words, merely the de-bonding layer 104A is formed over the carrier 102. In certain embodiments, a die-attach film (not shown) may be directly formed on the de-bonding layer 104A for the attachment to above components.

Figure 2:
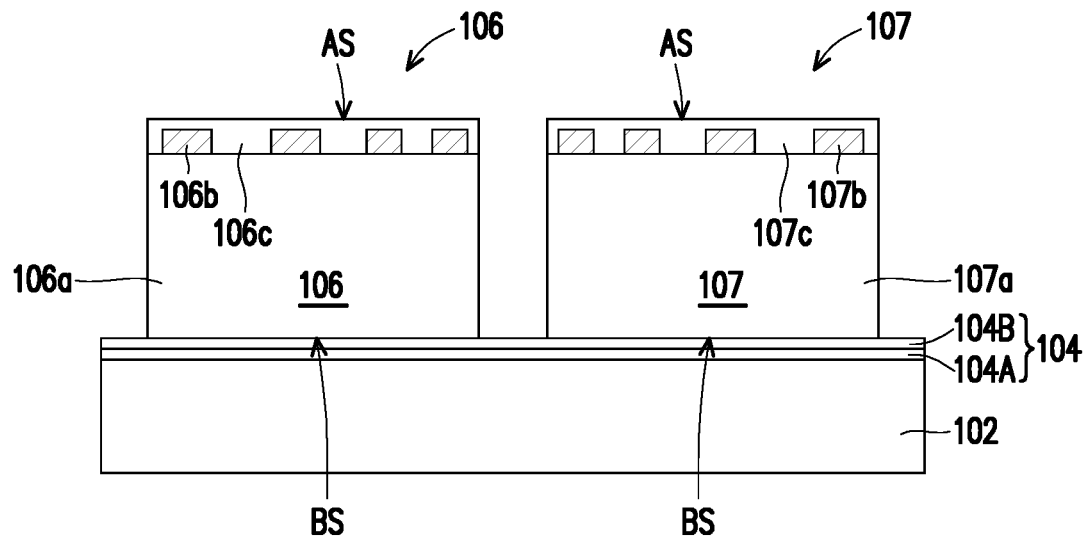

Referring to FIG. 2, a first semiconductor die 106 and a second semiconductor die 107 are bonded on the buffer layer 104. In some embodiments, the first semiconductor die 106 and the second semiconductor die 107 are bonded on the buffer layer 104 through the die-attach film. In the exemplary embodiment, each of the first semiconductor die 114A and the second semiconductor die 114B includes a semiconductor substrate (106a/107a). The semiconductor substrate (106a/107a) may be a bulk silicon substrate or a silicon-on-insulator (SOI) substrate, and further includes active components (e.g., transistors or the like) and optionally passive components (e.g., resistors, capacitors, inductors or the like) formed therein. Furthermore, each of the first semiconductor die 106 and the second semiconductor die 107 has an active surface AS and a backside surface BS opposite to the active surface AS. As shown in FIG. 2, a plurality of conductive vias (106b/107b) are located on the active surface AS of the first semiconductor die 106 and the second semiconductor die 107. In some embodiments, the plurality of conductive vias (106b/107b) is formed on the semiconductor substrate (106a/107a) by plating. In certain embodiments, a protection layer (106c/107c) is formed over the plurality of conductive vias (106b/107b) to cover and protect the conductive vias (106b/107b).

Figure 3:
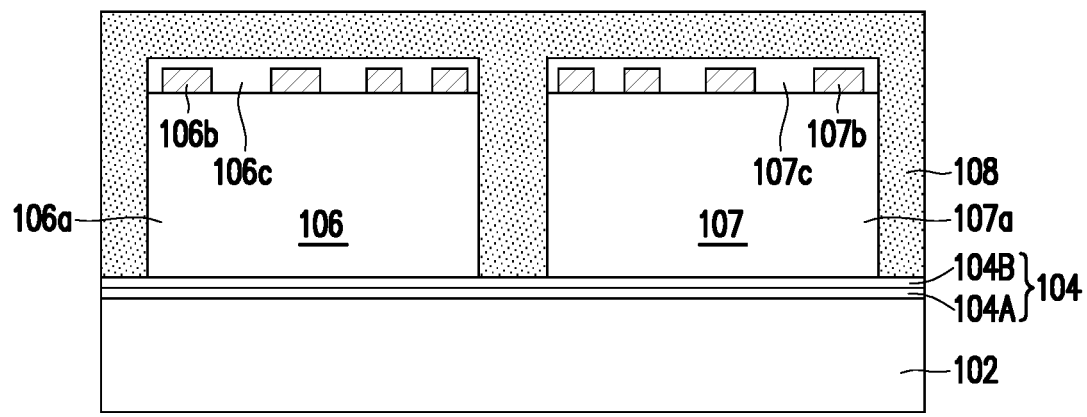

Referring to FIG. 3, after bonding the first semiconductor die 106 and the second semiconductor die 107 on the buffer layer 104, an insulating material 108 is formed over the buffer layer 104 to cover the first semiconductor die 106 and the second semiconductor die 107. In some embodiments, the insulating material 108 is formed through, for example, a compression molding process, filling up the gaps between the semiconductor dies (106/107) and encapsulating the semiconductor dies (106/107). At this stage, the conductive vias (106b/107b) and the protection layer (106c/107c) of the semiconductor dies (106/107) are encapsulated by and well protected by the insulating material 108. In other words, the conductive vias (106b/107b) and the protection layer (106c/107c) of the semiconductor dies (106/107) are not revealed and are well protected by the insulating material 108.

In some embodiments, the insulating material 108 for example, include polymers (such as epoxy resins, phenolic resins, silicon-containing resins, or other suitable resins), dielectric materials having low permittivity (Dk) and low loss tangent (Df) properties, or other suitable materials. In certain embodiments, the insulating material 108 may further include inorganic filler or inorganic compounds (e.g. silica, clay, and so on) which can be added therein to optimize coefficient of thermal expansion (CTE) of the insulating material 108. The disclosure is not limited thereto.

Figure 4:
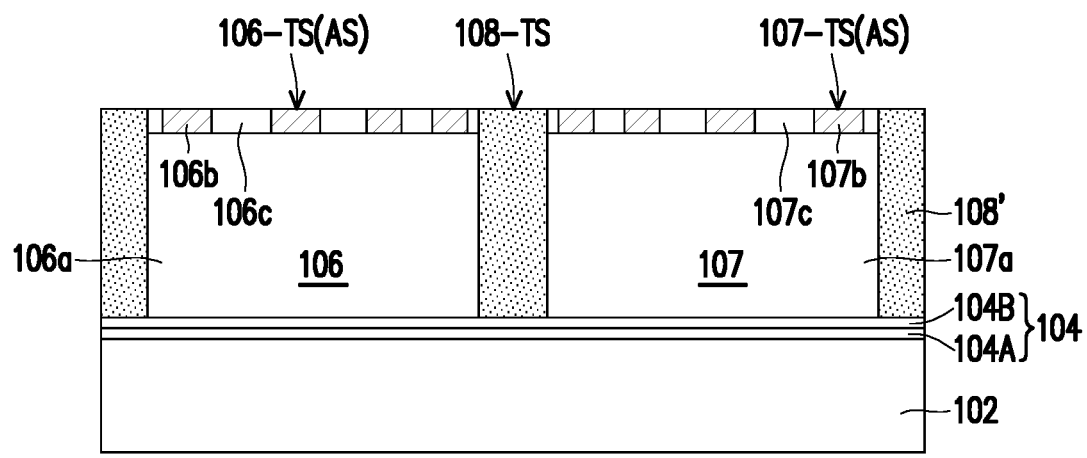

Referring to FIG. 4, in a subsequent step, the insulating material 108 is partially removed to expose the conductive vias (106b/107b) of the first semiconductor die 106 and the second semiconductor die 107. In some embodiments, the insulating material 108 and the protection layer (106c/107c) are ground or polished by a planarization step. For example, the planarization step is performed through a mechanical grinding process and/or a chemical mechanical polishing (CMP) process until the active surface (AS) or the top surfaces (106-TS/107-TS) of the conductive vias (106b/107b) are revealed. In some embodiments, the insulating material 108 is polished to form a molding compound 108'. In some embodiments, after the planarization step, the top surfaces (106-TS/107-TS) of the conductive vias (106b/107b), the active surface AS of the first semiconductor die 106 and the second semiconductor die 107, and the top surface 108-TS of the molding compound 108' are coplanar and levelled with one another. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

Figure 5:
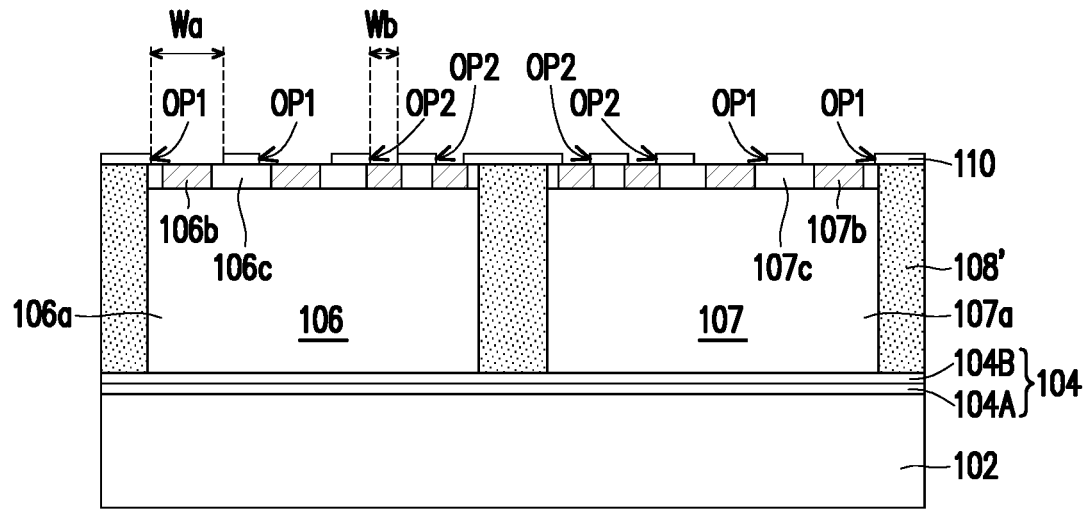

Referring to FIG. 5, after the planarization step, a dielectric layer 110 is formed on the molding compound 108', and over the first semiconductor die 106 and the second semiconductor die 107. The dielectric layer 110 may be made of dielectric materials such as benzocyclobutene ("BCB"), polybenzoxazole ("PBO"), or any other suitable polymer-based dielectric material. In the exemplary embodiment, the dielectric layer 110 is patterned to form a plurality of first openings OP1 and a plurality of second openings OP2. In some embodiments, the plurality of first openings OP1 surround the plurality of second openings OP2, and a width Wa of the plurality of first openings OP1 is greater than a width Wb of the plurality of second openings OP2. In certain embodiments, the width Wa of the first openings OP2 is larger than 20 µm and the width Wb of the second openings OP2 is smaller than 15 µm. In one embodiment, the width Wa of the first openings OP1 is in a range of 20 µm to 300 µm, and the width Wb of the second openings OP2 is in a range of 5 µm to 15 µm.

Figure 6:
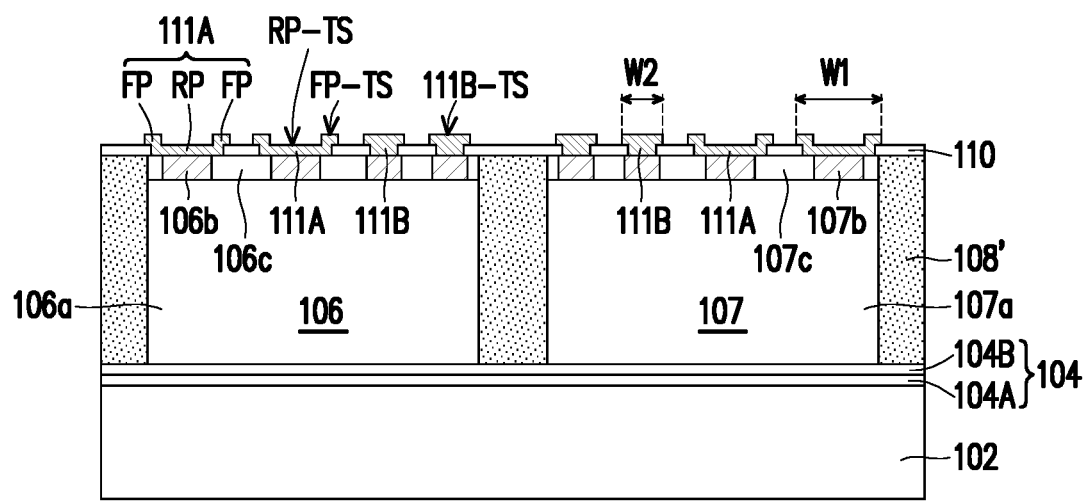

Referring to FIG. 6, after forming the dielectric layer 110 with the first openings OP1 and the second openings OP2, a plurality of first conductive features 111A is formed in the first openings OP1, and a plurality of second conductive features 111B is formed in the second openings OP2. In the exemplary embodiment, the first conductive features 111A surrounds the second conductive features 111B. Furthermore, the first conductive features 111A and the second conductive features 111B may be electrically connected to the conductive vias (106b/107b) of the first semiconductor die 106 and the second semiconductor die 107. In some embodiments, a width W2 of the second conductive features 111B is smaller than a width W1 of the first conductive features 111A. In certain embodiments, the width W1 of the first conductive features 111A is in a range of 25 µm to 300 µm, and the width W2 of the second conductive features 111B is in a range of 10 µm to 40 µm.

Furthermore, in the exemplary embodiment, the first conductive features 111A are formed with flank portions FP and a recessed portion RP joining the flank portions FP, and the recessed portion RP being physically connected to the conductive vias (106b/107b) of the first semiconductor die 106 and the second semiconductor die 107. In some embodiments, the second conductive features 111B are disposed adjacent to the first conductive features 111A and on the molding compound 108' and being physically connected to the conductive vias (106b/107b) of the first semiconductor die 106 and the second semiconductor die 107. In some embodiments, a depth Dx of the recessed portion RP of the first conductive features 111A is in a range of 2 µm to 10 µm. In other words, a level of a top surface FP-TS of the flank portions FP is higher than a level of a top surface RP-TS of the recessed portions RP in the first conductive feature 111A. In certain embodiments, the top surface FP-TS of the flank portions FP of the first conductive features 111A is substantially coplanar with a top surface 111B-TS of the second conductive features 111B.

Figure 7:
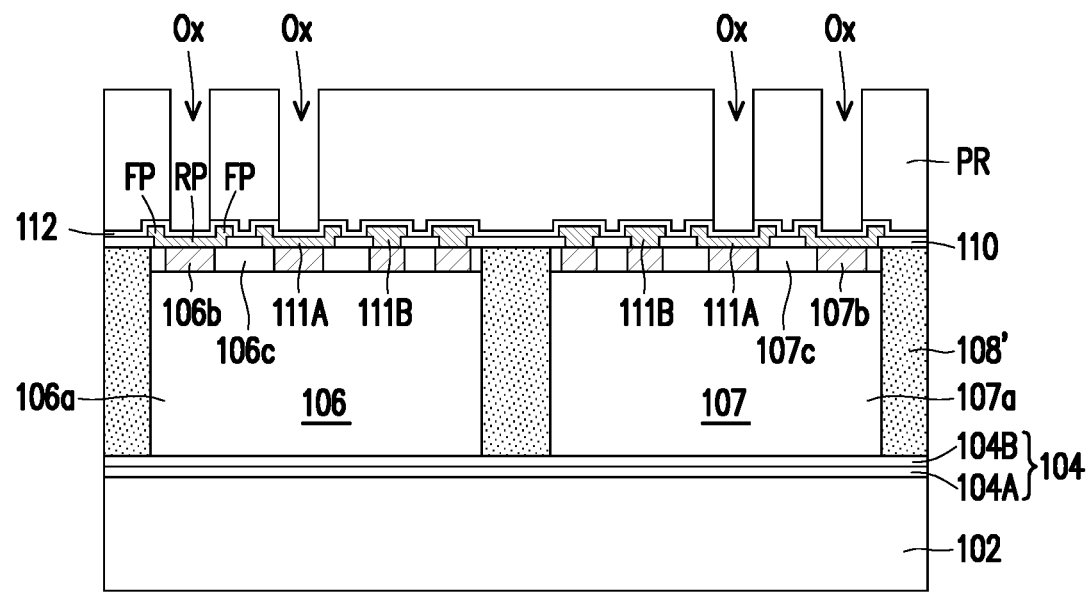
Figure 8:
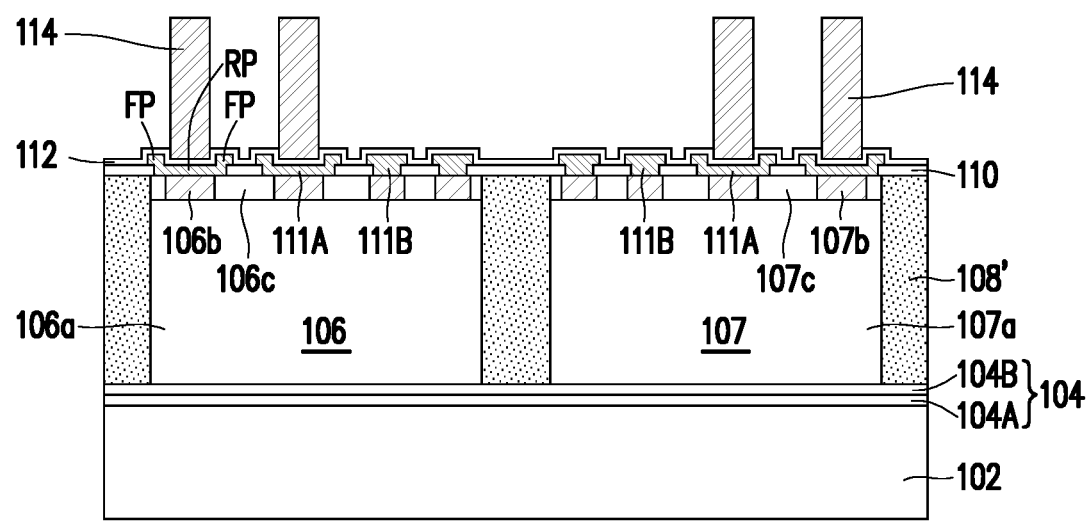
Figure 9:
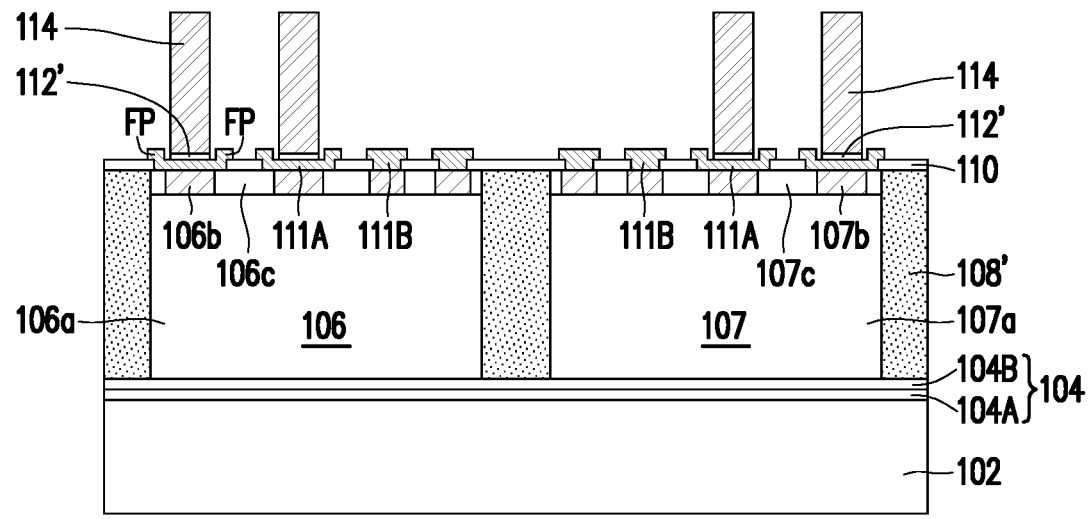

After forming the first conductive features 111A and the second conductive features 111B, a plurality of through insulator vias 114 may be formed on the recessed portion RP of the first conductive features 11A according to the steps shown in FIG. 7 to FIG. 9.

In some embodiments, as illustrated in FIG. 7, a seed layer 112 is first formed on the dielectric layer 110 to conformally cover the first conductive features 111A and the second conductive features 111B. The material of the seed layer 112 varies depending on the material of the later-formed through insulator vias 114. In some embodiments, the seed layer 112 is formed by electroless plating, chemical vapor deposition (CVD), physical vapor deposition (PVD), atomic layer deposition (ALD), high density plasma CVD (HDPCVD) or combinations thereof. In one embodiment, the seed layer 112 is formed by sequentially depositing or sputtering a titanium layer and a copper layer. In a next step, after forming the seed layer 112, a photoresist pattern PR is provided on the seed layer 112 to cover the second conductive features 111B and the flank portions FP of the first conductive features 111A. In some embodiments, the photoresist pattern PR has openings Ox that expose portions of the seed layer 112 located above the recessed portions RP of the first conductive features 111A. In other words, a position of the openings Ox corresponds to a position where the recessed portions RP are located.

Referring to FIG. 8, a metallic material (not shown) is formed on the exposed portions of the seed layer 112 to fill up the openings Ox by electroplating or deposition, and the photoresist pattern PR is then removed to form a plurality of through insulator vias 114. As illustrated in FIG. 8, each of the through insulator vias 114 are disposed on the recessed portions RP of the first conductive features 111A. In some embodiments, the through insulator vias 114 may be electrically connected to the first semiconductor die 106 and the second semiconductor die 107 through the first conductive features 111A. In certain embodiments, the through insulator vias 114 are electrically connected to the recessed portions RP of the first conductive features 111A through the seed layer 112. In some embodiments, the material of the through insulator vias 114 may include copper or copper alloys. In certain embodiments, the through insulator vias 114 are copper pillars. In the exemplary embodiment, since the through insulator vias 114 are located on the recessed portions RP of the first conductive features 111A, the strength of the through insulator vias 114 may be improved, and a collapse issue of the through insulator vias 114 may be prevented during the stripping of the photoresist pattern PR (shown in FIG. 7). In other words, the concaved or curved outline of the first conductive features 111A provides a stable platform to form the through insulator vias 114.

Referring to FIG. 9, after forming the through insulator vias 114 and removing the photoresist pattern PR, portions of the seed layer 112 exposed by the through insulator vias 114 are removed. In other words, portions of the seed layer 112 are removed to form a plurality of seed layers 112' disposed in between the recessed portion RP of the first conductive features 111A and the through insulator vias 114. In some embodiments, sidewalls of the seed layers 112' are aligned with sidewalls of the through insulator vias 114. In certain embodiments, the seed layers 112' and portions of the through insulator vias 114 may be surrounded by the flank portions FP of the first conductive features 111A.

Figure 10:
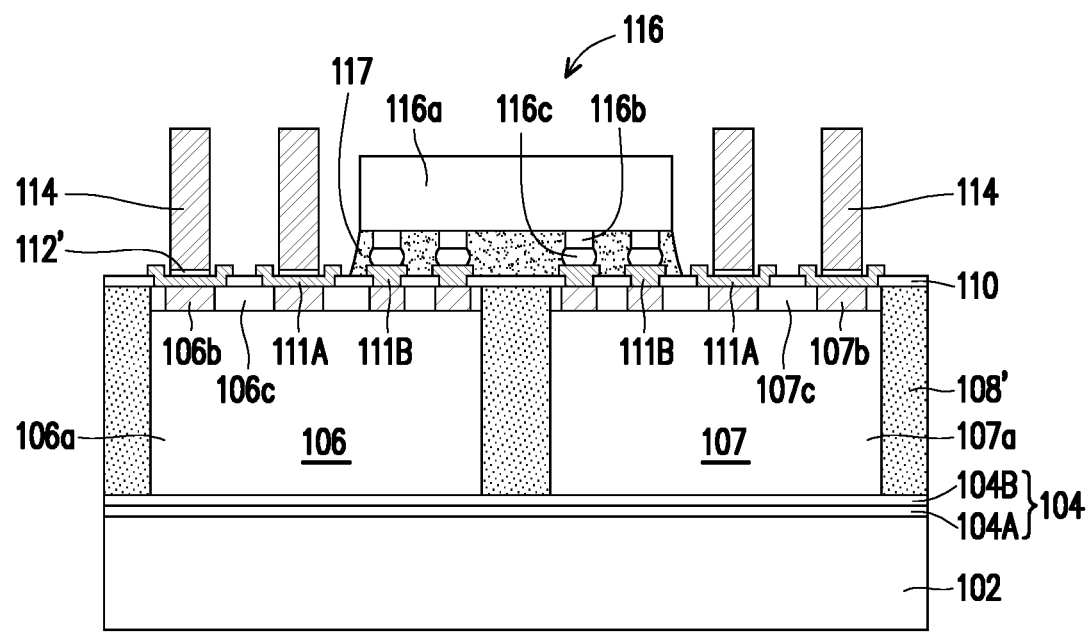

Referring to FIG. 10, after forming the through insulator vias 114, an interconnect structure 116 is disposed on the second conductive features 111B. The interconnect structure 116 is electrically connected to the first semiconductor die 106 and the second semiconductor die 107 through the second conductive features 111B. Furthermore, the interconnect structure 116 electrically connects the first semiconductor die 106 to the second semiconductor die 107. That is, the interconnect structure 116 may be used for providing short inter-connection between the semiconductor dies (106/107). In some embodiments, the interconnect structure 116 may for example, include a silicon interconnect 116a, a plurality of conductive vias 116b and a plurality of conductive bumps 116c. In some embodiments, the plurality of conductive vias 116b is disposed on the silicon interconnect 116a, while the plurality of conductive bumps 116c is disposed on the plurality of conductive vias 116b. In certain embodiments, the silicon interconnect 116a may be electrically connected to the second conductive features 111B through the conductive vias 116b and the conductive bumps 116c. After placing the interconnect structure 116 on the second conductive features 111B, an underfill structure 117 may fill up the gaps in between the conductive vias 116b, in between the conductive bumps 116c, and to encapsulate the conductive vias 116b, the conductive bumps 116c and the second conductive features 111B. In the exemplary embodiment, the interconnect structure 116 is disposed on the second conductive features 111B after forming the through insulator vias 114. However, the disclosure is not limited thereto. In some alternative embodiments, the interconnect structure 116 may be disposed on the second conductive features 111B prior to forming the through insulator vias 114.

Figure 11:
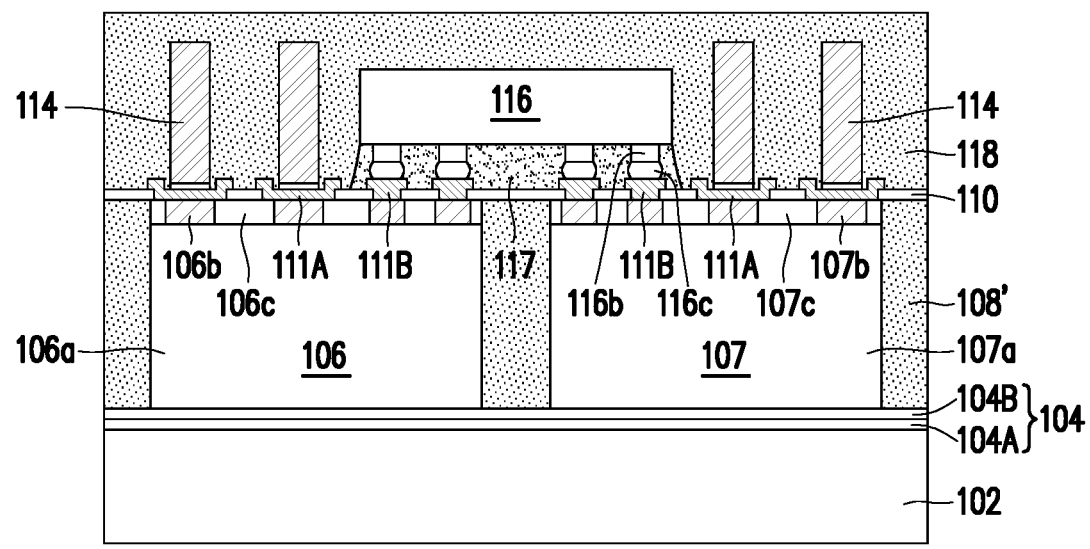

Referring to FIG. 11, in a next step, an insulating material 118 is formed over the through insulator vias 114 and the interconnect structure 116 to encapsulate the through insulator vias 114 and the interconnect structure 116. In some embodiments, the insulating material 118 is formed through, for example, a compression molding process, filling up the gaps between the interconnect structure 116 and adjacent through insulator vias 114. At this stage, the interconnect structure 116 and the through insulator vias 114 are encapsulated and well protected by the insulating material 118.

Figure 12:
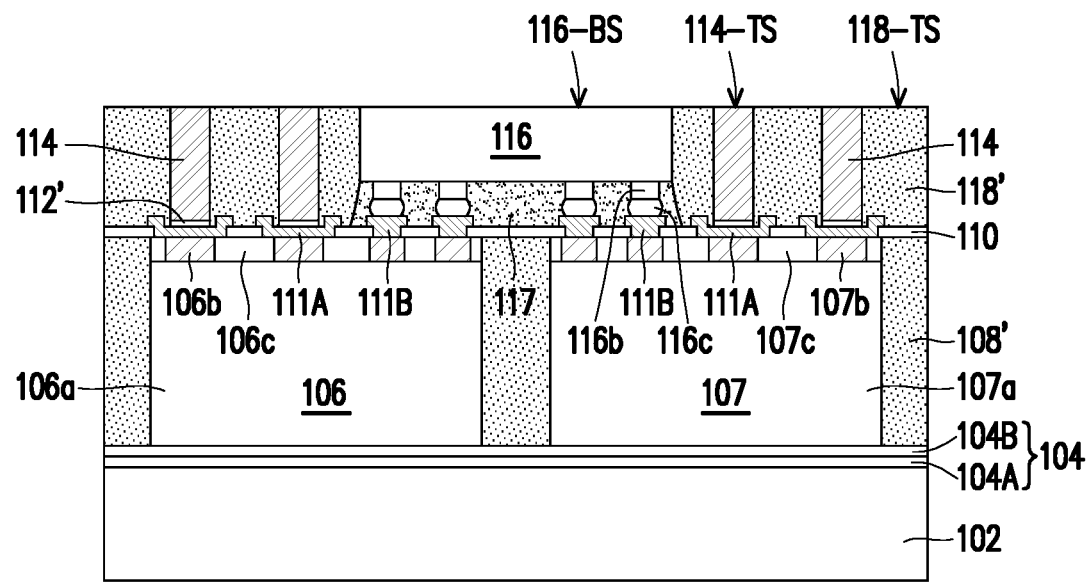

Referring to FIG. 12, a thinning step is performed to form an insulating encapsulant 118'. In the exemplary embodiment, the thickness of the insulating material 118 is reduced until top surfaces 114-TS of the through insulator vias 114 and backside surface 116-BS of the interconnect structure 116 are revealed. In certain embodiments, the insulating material 118 is ground or polished by a mechanical grinding process and/or a chemical mechanical polishing (CMP) process until the backside surface 116-BS of the interconnect structure 116 is revealed. In some embodiments, the through insulator vias 114 may be partially polished so that the top surfaces 107-TS of the through insulator vias 107B are levelled with the top surfaces 108-TS of the conductive posts 108B. The insulating material 118 is polished to form an insulating encapsulant 118'. In some embodiments, the top surface 118-TS of the insulating encapsulant 110', the top surface 118-TS of the through insulator vias 114, and the backside surface 116-BS of the interconnect structure 116 are coplanar and levelled with one another.

In some embodiments, the insulating material 118 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating material 118 may include an acceptable insulating encapsulation material. In some embodiments, the insulating material 118 may further include inorganic filler or inorganic compound (e.g. silica, clay, and so on) which can be added therein to optimize coefficient of thermal expansion (CTE) of the insulating material 118. In certain embodiments, the insulating material 118 may be the same or different than the insulating material 108. The disclosure is not limited thereto.

Figure 13:
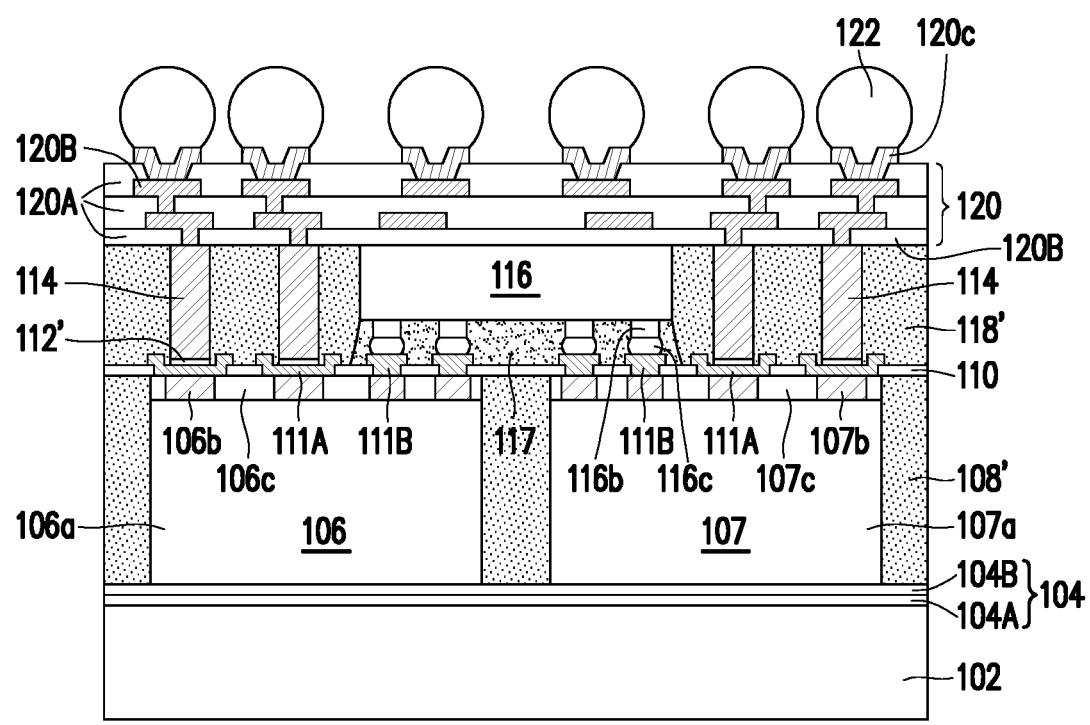

Referring to FIG. 13, after the thinning step, a redistribution layer 120 is formed on the insulating encapsulant 118' over the interconnect structure 116 and the through insulator vias 114. In some embodiments, the redistribution layer 120 may include a plurality of dielectric layers 120A and a plurality of conductive elements 120B alternately stacked. Although only two layers of the conductive elements 120B and three layers of dielectric layers 120A are illustrated herein, however, the scope of the disclose is not limited by the embodiments of the disclosure. In other embodiments, the number of conductive elements 120B and the dielectric layers 120A may be adjusted based on product requirement. In some embodiments, the conductive elements 120B are electrically connected to first semiconductor die 106 and the second semiconductor die 107 through the through insulator vias 114.

In some embodiments, the material of the dielectric layers 120A may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layers 120A are formed by suitable fabrication techniques such as spin-on coating, chemical vapor deposition (CVD), plasma-enhanced chemical vapor deposition (PECVD) or the like. The disclosure is not limited thereto.

In some embodiments, the material of the conductive elements 120B may be made of conductive materials formed by electroplating or deposition, such as aluminum, titanium, copper, nickel, tungsten, and/or alloys thereof, which may be patterned using a photolithography and etching process. In some embodiments, the conductive elements 120B may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

After forming the redistribution layer 120, a plurality of conductive pads 120C may be disposed on an exposed top surface of the topmost layer of the conductive elements 120B for electrically connecting with conductive terminals (e.g. conductive balls). In certain embodiments, the conductive pads 120C are for example, under-ball metallurgy (UBM) patterns used for ball mount. As shown in FIG. 13, the conductive pads 120C are formed on and electrically connected to the redistribution layer 120. In some embodiments, the materials of the conductive pads 120C may include copper, nickel, titanium, tungsten, or alloys thereof or the like, and may be formed by an electroplating process, for example. The number of conductive pads 120C are not limited in this disclosure, and may be selected based on the design layout. In some alternative embodiments, the conductive pads 120C may be omitted. In other words, conductive terminals 122 formed in subsequent steps may be directly disposed on the redistribution layer 120.

As illustrated in FIG. 13, after forming the conductive pads 120C, a plurality of conducive terminals 122 are disposed on the conductive pads 120C and over the redistribution layer 120. In some embodiments, the conductive terminals 122 may be disposed on the conductive pads 120C by ball placement process or reflow process. In some embodiments, the conductive terminals 122 are, for example, solder balls or ball grid array (BGA) balls. In some embodiments, the conductive terminals 122 are connected to the redistribution layer 120 through the conductive pads 120C. In certain embodiments, some of the conductive terminals 122 may be electrically connected to the semiconductor dies (106/107) through the redistribution layer 120. The number of the conductive terminals 122 is not limited to the disclosure, and may be designated and selected based on the number of the conductive pads 120C.

Figure 14:
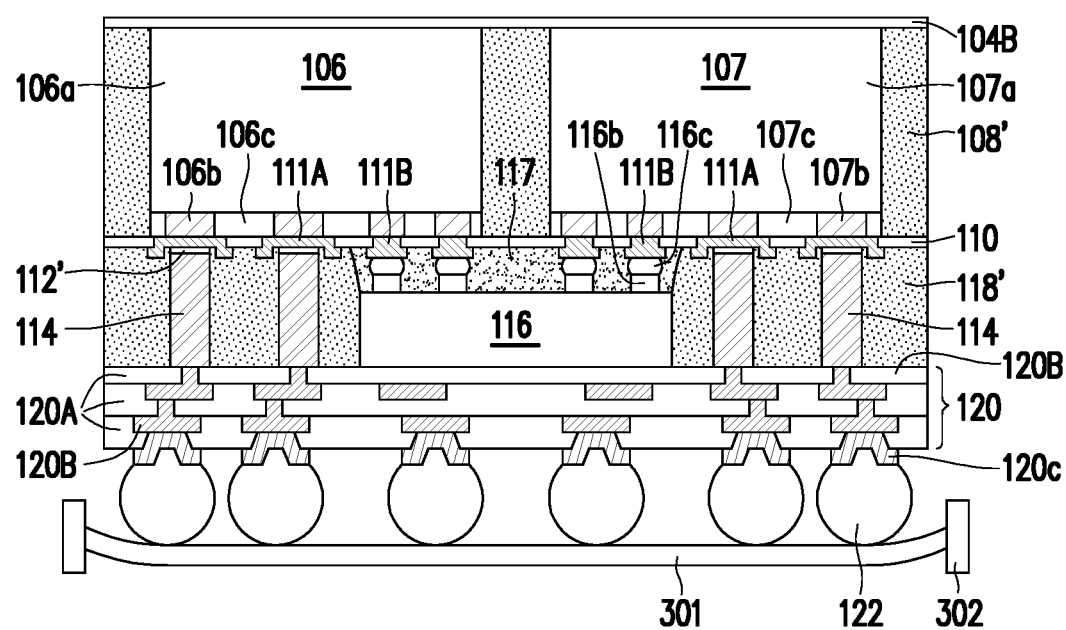
Figure 15:
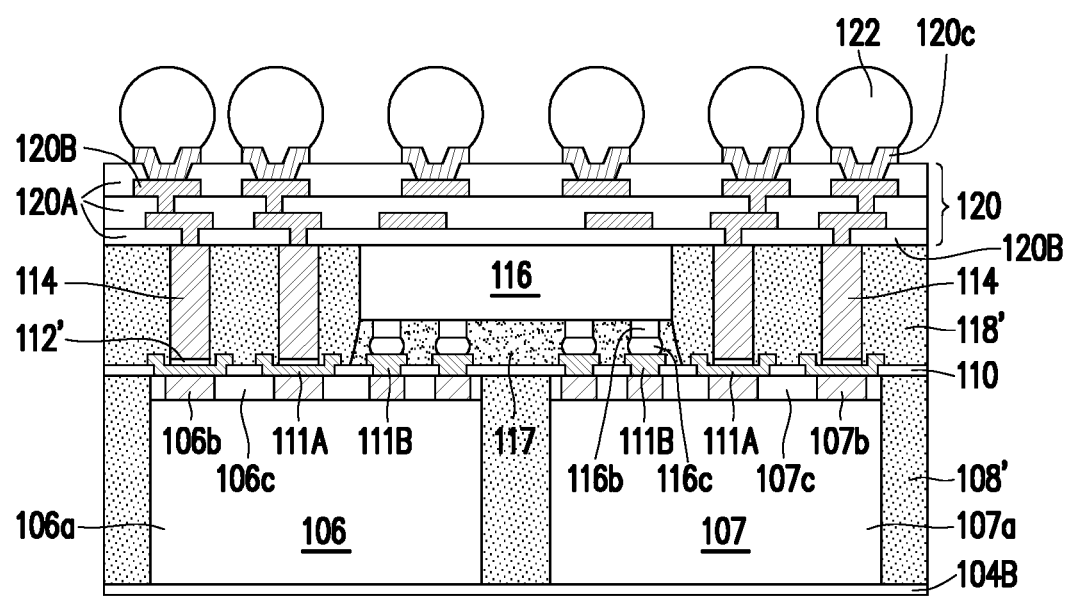

Referring to FIG. 14, after forming the redistribution layer 120 and placing the conductive terminals 122 thereon, the structure shown in FIG. 13 is turned upside down and attached to a tape 301 (e.g., a dicing tape 301) supported by a frame 302. In some embodiments, the carrier 102 is debonded so as to separate the first semiconductor die 106 and the second semiconductor die 107 from the carrier 102. In some embodiments, the de-bonding process include projecting a light such as a laser light or an UV light on the de-bonding layer 104A, so that the carrier 102 can be easily removed. In certain embodiments, the de-bonding layer 103 may be further removed or peeled off. After the de-bonding process, the dielectric layer 104B is revealed. In some alternative embodiments, the dielectric layer 104B is omitted, hence, the backside surface BS of the first semiconductor die 106 and the second semiconductor die 107 may be revealed. The disclosure is not limited thereto. Upon completion of the de-bonding process, a package structure PK as illustrated in FIG. 15 according to some embodiments of the present disclosure is accomplished.

According to the above embodiments, the package structure is formed with first conductive features having flank portions and a recessed portion joining the flank portions. Since the through insulator vias are formed on the recessed portions of the first conductive features with the flank portions surrounding the through insulator vias, the strength of the through insulator vias may be improved, and a collapse issue of the through insulator vias may be prevented during the stripping of the photoresist pattern. In other words, the concaved or curved outline of the first conductive features provides a stable platform to form the through insulator vias.

In some embodiments of the present disclosure, a package structure including a first semiconductor die, a second semiconductor die, a molding compound, an interconnect structure, a plurality of first conductive features, a plurality of through insulator vias, an insulating encapsulant and a redistribution layer is provided. The second semiconductor die is disposed adjacent to the first semiconductor die. The molding compound is encapsulating the first semiconductor die and the second semiconductor die. The interconnect structure is disposed on the molding compound and electrically connecting the first semiconductor die to the second semiconductor die. The plurality of first conductive features is disposed on the molding compound and electrically connected to the first semiconductor die and the second semiconductor die, wherein each of the first conductive features has a recessed portion. The plurality of through insulator vias is disposed on the recessed portion of the plurality of first conductive features and electrically connected to the first semiconductor die and the second semiconductor die, wherein the plurality of through insulator vias surrounds the interconnect structure. The insulating encapsulant is encapsulating the interconnect structure and the plurality of through insulator vias. The redistribution layer is disposed on the insulating encapsulant and over the interconnect structure, wherein the redistribution layer is electrically connected to the plurality of through insulator vias.

In another embodiment of the present disclosure, a package structure including a first semiconductor die, a second semiconductor die, a molding compound, a plurality of first conductive features, a plurality of second conductive features, an interconnect structure, a plurality of through insulator vias, an insulating encapsulant and a redistribution layer is provided. The first semiconductor die has a plurality of conductive vias. The second semiconductor die is disposed adjacent to the first semiconductor die and has a plurality of conductive vias. The molding compound is encapsulating the first semiconductor die and the second semiconductor die. The plurality of first conductive features is disposed on the molding compound and physically connected to the plurality of conductive vias of the first semiconductor die and the plurality of conductive vias of the second semiconductor die, wherein each of the first conductive features comprises flank portions and a recessed portion joining the flank portions. The plurality of second conductive features is disposed adjacent to the plurality of first conductive features and on the molding compound and physically connected to the plurality of conductive vias of the first semiconductor die and the plurality of conductive vias of the second semiconductor die. The interconnect structure is disposed on the plurality of second conductive features and electrically connecting the first semiconductor die to the second semiconductor die. The plurality of through insulator vias is disposed on the recessed portion of the plurality of first conductive features and electrically connected to the first semiconductor die and the second semiconductor die, wherein the plurality of through insulator vias surrounds the interconnect structure. The insulating encapsulant is encapsulating the interconnect structure and the plurality of through insulator vias. The redistribution layer is disposed on the insulating encapsulant and over the interconnect structure, wherein the redistribution layer is electrically connected to the plurality of through insulator vias.

In yet another embodiment of the present disclosure, a method of fabricating a package structure is described. The method includes the following steps. A carrier is provided. A first semiconductor die having a plurality of conductive vias is disposed on the carrier. A second semiconductor die having a plurality of conductive vias is disposed on the carrier adjacent to the first semiconductor die. The molding compound is formed to encapsulate the first semiconductor die and the second semiconductor die. The dielectric layer is formed on the molding compound and the dielectric layer is patterned to form a plurality of first openings and a plurality of second openings, wherein the plurality of first openings surround the plurality of second openings, and a width of the plurality of first openings is greater than a width of the plurality of second opening. A plurality of first conductive features is formed in the plurality of first openings, wherein the plurality of first conductive features is formed with flank portions and a recessed portion joining the flank portions, and the recessed portion being physically connected to the plurality of conductive vias of the first semiconductor die and the plurality of conductive vias of the second semiconductor die. A plurality of second conductive features is formed in the plurality of second openings, wherein the plurality of second conductive features is physically connected to the plurality of conductive vias of the first semiconductor die and the plurality of conductive vias of the second semiconductor die. A plurality of through insulator vias is formed on the recessed portion of the plurality of first conductive features, the plurality of through insulator vias being electrically connected to the first semiconductor die and the second semiconductor die. An interconnect structure is disposed on the plurality of second conductive features and electrically connecting the first semiconductor die to the second semiconductor die. An insulating encapsulant is formed to encapsulate the interconnect structure and the plurality of through insulator via. A redistribution layer is formed on the insulating encapsulant and over the interconnect structure, wherein the redistribution layer is electrically connected to the plurality of through insulator vias. The carrier is de-bonded.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
    a semiconductor die;
    a plurality of conductive features electrically connected to the semiconductor die, wherein the plurality of conductive features comprises a first group with planar top surfaces, and a second group with uneven top surfaces;
    a bridge structure partially overlapped with the semiconductor die and electrically connected to the first group of the plurality of conductive features;
        an underfill covering and contacting the first group of the plurality of conductive features;
        via structures disposed on and overlapped with the semiconductor die and electrically connected to the second group of the plurality of conductive features; and
        an encapsulant covering and contacting the via structures and the second group of the plurality of conductive features.

2. The structure according to claim 1, further comprising a molding compound surrounding the semiconductor die, wherein sidewalls of the molding compound are aligned with sidewalls of the encapsulant.

3. The structure according to claim 2, further comprising a dielectric layer sandwiched between the molding compound and the encapsulant.

4. The structure according to claim 2, further comprising a dielectric layer disposed on the molding compound and covering a backside of the semiconductor die.

5. The structure according to claim 1, further comprising a plurality of seed layers disposed in between the via structures and the second group of the plurality of conductive features.

6. The structure according to claim 1, wherein a width of the first group of the plurality of conductive features is smaller than a width of the second group of the plurality of conductive features.

7. The structure according to claim 1, further comprising a redistribution layer disposed over the bridge structure and electrically connected to the via structures.

8. The structure according to claim 1, wherein the bridge structure comprises:
    a silicon interconnect;
    a plurality of conductive vias disposed on the silicon interconnect; and
    a plurality of conductive bumps disposed on the plurality of conductive via, wherein the underfill covers and contacts the plurality of conductive vias and the plurality of conductive bumps.

9. A structure, comprising:
    an interconnect structure having conductive bumps;
    through vias surrounding the interconnect structure;
    die connecting vias electrically connected to the interconnect structure and the through vias; and
    conductive features sandwiched between the conductive bumps and the die connecting vias, and sandwiched between the through vias and the die connecting vias, wherein a thickness of a first portion of the conductive features in between the through vias and the die connecting vias is smaller than a thickness of a second portion of the conductive features in between conductive bumps and the die connecting vias.

10. The structure according to claim 9, further comprising:
a protection layer surrounding the die connecting vias; and
a dielectric layer disposed on the protection layer and partially surrounding the conductive features.

11. The structure according to claim 9, further comprising:
a molding compound surrounding the die connecting vias; and
an insulating encapsulant surrounding the interconnect structure and the through vias.

12. The structure according to claim 11, further comprising a redistribution layer disposed on the insulating encapsulant and electrically connected to the through vias, wherein sidewalls of the redistribution layer are aligned with sidewalls of the insulating encapsulant and sidewalls of the molding compound.

13. The structure according to claim 11, further comprising an underfill structure covering the conductive bumps of the interconnect structure, and wherein the insulating encapsulant further encapsulates the underfill structure.

14. The structure according to claim 9, wherein the die connecting vias are disposed on a first semiconductor substrate, and on a second semiconductor substrate separated from the first semiconductor substrate.

15. The structure according to claim 14, wherein the interconnect structure is partially overlapped with the first semiconductor substrate and the second semiconductor substrate.

16. A semiconductor package, comprising:
a first die and a second die;
an insulating material separating the first die from the second die;
first conductive elements disposed on the first die and the second die in a central region of the semiconductor package;
a bridge structure disposed on the first conductive elements in the central region, and electrically connecting the first die to the second die;
second conductive elements disposed on the first die and the second die in a peripheral region of the semiconductor package, wherein the peripheral region surrounds the central region, and a width of the second conductive elements in the peripheral region is greater than a width of the first conductive elements in the central region; and
a redistribution layer disposed on the bridge structure and electrically connected to the second conductive elements.

17. The semiconductor package according to claim 16, further comprising a plurality of through vias disposed on the second conductive elements in the peripheral region to surround the bridge structure, wherein the redistribution layer is electrically connected to the second conductive elements through the plurality of through vias.

18. The semiconductor package according to claim 17, wherein each of the second conductive elements comprises a recessed portion, and the plurality of through vias is disposed on the recessed portion.

19. The semiconductor package according to claim 18, wherein each of the second conductive elements further comprises flank portions, the recessed portion is joining the flank portions, and a level of a top surface of the flank portions is higher than a level of a top surface of the recessed portion.

20. The semiconductor package according to claim 16, further comprising an underfill structure disposed in the central region in between the bridge structure and the first conductive elements.

* * * * *